United States Patent
Kalia et al.

(10) Patent No.: US 9,780,726 B2
(45) Date of Patent: *Oct. 3, 2017

(54) RE-CONFIGURABLE SINGLE TRANSFORMER QUADRATURE VOLTAGE CONTROLLED OSCILLATOR

(71) Applicant: TEXAS INSTRUMENTS INCORPORATED, Dallas, TX (US)

(72) Inventors: Sachin Kalia, Minneapolis, MN (US); Bradley A. Kramer, Plano, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/289,349

(22) Filed: Oct. 10, 2016

(65) Prior Publication Data
US 2017/0194909 A1    Jul. 6, 2017

Related U.S. Application Data

(63) Continuation of application No. 14/986,604, filed on Dec. 31, 2015, now Pat. No. 9,490,747.

(51) Int. Cl.
*H03B 27/00* (2006.01)
*H03B 5/12* (2006.01)

(52) U.S. Cl.
CPC .......... *H03B 27/00* (2013.01); *H03B 5/1212* (2013.01)

(58) Field of Classification Search
CPC .... H03B 5/1212; H03B 5/124; H03B 5/1256; H03B 5/1268; H03B 5/1296
See application file for complete search history.

(56) References Cited

U.S. PATENT DOCUMENTS

| | | | |
|---|---|---|---|
| 7,423,495 B2 | 9/2008 | Bevilacqua | |
| 8,183,948 B2 | 5/2012 | Ainspan et al. | |
| 8,593,232 B2 * | 11/2013 | Chataigner | H03B 5/1228 331/117 FE |

OTHER PUBLICATIONS

A Low-Noise Quadrature VCO Based on Magnetically Coupled Resonators and a Wideband Frequency Divider at Millimeter Waves; Ugo Decanis, Andrea Ghilioni, Enrico Monaco, Andrea Mazzanti, and Francesco Svelto; 0018-9200; 2011 IEEE; pp. 2943-2955.

SiGe HBT Quadrature VCO Utilizing Trifilar Transformers; Jin-Siang Syu, Chinchun Meng, and Guo-Wei Huang; 978-1-4244-2605-8/08; 2008 IEEE; pp. 465-468.

A 1V 17GHz 5mW Quadrature CMOS VCO based on Transformer Coupling; Alan W.L. Ng, Howard C. Luong; 1-4244-0079-1/06; 2006 IEEE; ISSCC 2006 / Session 11 / RF Building Blocks and PLLs / 11.4.

(Continued)

*Primary Examiner* — Jeffrey Shin
(74) *Attorney, Agent, or Firm* — John R. Pessetto; Charles A. Brill; Frank D. Cimino (57) ABSTRACT

A quadrature voltage controlled oscillator (QVCO). The QVCO includes a first node for providing a first quadrature signal, a second node for providing a second quadrature signal, a third node for providing a third quadrature signal, and a fourth node for providing a fourth quadrature signal. The QVCO further includes a first coil connected between the first node and the second node and a second coil connected between the third node and the fourth node. The first coil and second coil are positively magnetically coupled.

1 Claim, 6 Drawing Sheets

(56) References Cited

OTHER PUBLICATIONS

An optimally transformer coupled, 5GHz Quadrature VCO in a 0.18pm digital CMOS process; A. Ravi, K. Soumyanath, Ralph E. Bishop, Bradley A. Bloechel, L. R. Carley; 4-891 14-034-8; 2003 Svmoosium on VLSI Circuits Digest of Technical Papers; pp. 141-144.

* cited by examiner

RE-CONFIGURABLE SINGLE TRANSFORMER QUADRATURE VOLTAGE CONTROLLED OSCILLATOR

CROSS-REFERENCES TO RELATED APPLICATIONS

This continuation application claims priority to U.S. patent application Ser. No. 14/986,604, filed Dec. 31, 2015, which application is hereby incorporated by reference.

STATEMENT REGARDING FEDERALLY SPONSORED RESEARCH OR DEVELOPMENT

Not Applicable.

BACKGROUND OF THE INVENTION

The preferred embodiments relate to voltage controlled oscillator (VCO) technology and, more particularly, to a quadrature VCO (QVCO).

A VCO is a device (i.e., oscillator) that outputs an oscillating signal with a frequency that is controlled by the level of an input voltage applied to the VCO. A fixed DC input voltage to the VCO, therefore, should ideally produce a fixed output frequency signal, whereas that input voltage also may be varied so as to vary the VCO output frequency. As to the latter, therefore, a modulating input signal may be applied to cause the VCO to output a signal with a modulating frequency (or phase).

A certain type of modulation scheme that packs more than 1 bit/symbol for communicating data, and relevant to the preferred embodiments is quadrature phase-shift keying (QPSK). In QPSK, a VCO provides quadrature oscillating signals, thereby operating as a QVCO, where the quadrature signals consist of four different oscillating signals, each 90 degrees apart from the others. More specifically, as a type of phase-shift keying (PSK), QPSK communicates data by modulating (i.e., changing) a phase of a carrier signal. The term "quadrature" in QPSK indicates that there are four different phases, each preferably orthogonal with respect to one another, for the data modulation. More specifically, therefore, a single data quantity, or "symbol," may be represented by any one of the four available phases, typically equispaced in the QPSK constellation at locations that are 90 degrees apart from one another and located at angles $\pi/4$, $3\pi/4$, $5\pi/4$ and $7\pi/4$ to the real axis. Each location of these separate locations may represent a different one-of-four combination of two binary bits, thereby permitting communication of a symbol representing a binary value of 11, 01, 00, or 10. In QPSK, such data is modulated, and demodulated, typically by separating a bit stream into two separate bit streams, denoted as an in-phase stream designated as I and a quadrature phase designated as Q. The I data is modulated by a first signal (e.g., sine wave), while the Q data is modulated by a second signal that is 90 degrees apart (e.g., cosine wave) from the first signal, with the results added to provide the transmitted QPSK signal. Demodulation is achieved in a reverse process.

Given the preceding, of note in connection with QPSK methodology is that it involves quadrature phases, and in electronic circuits such phases are typically implemented using a VCO that is locked into quadratures, that is, having four different outputs that, as introduced earlier, are 90 degrees apart from one another. Such an architecture is typically referred to as a quadrature VCO, or abbreviated as QVCO. Further, quadrature local oscillation also may be used and be important in other applications, such as image rejection in receivers. By way of further background, therefore, three prior art QVCOs are described below.

Figure 1:
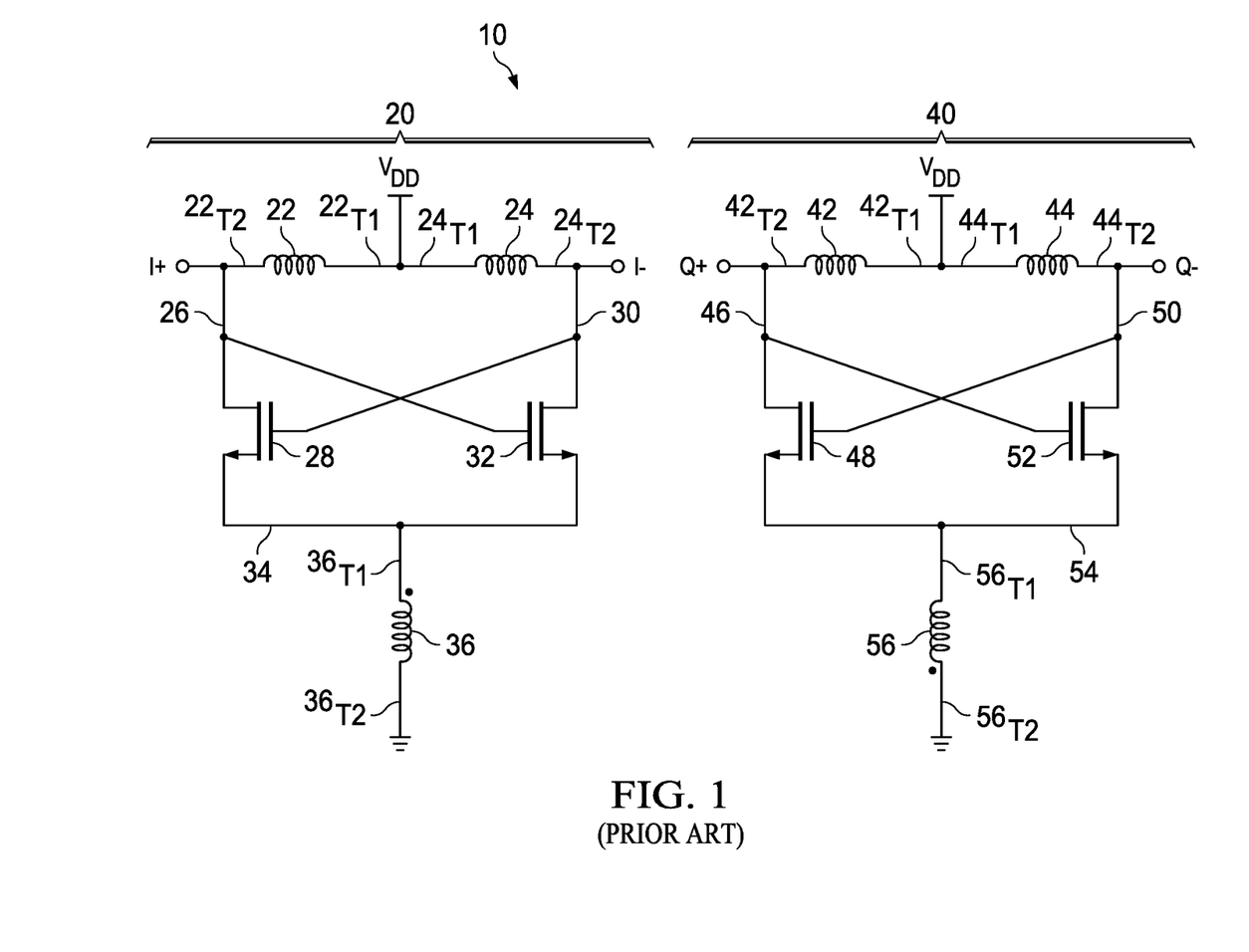
FIG. 1 illustrates an electrical schematic of a prior art source coupled QVCO.

FIG. 1 illustrates a schematic of a prior art source coupled QVCO shown generally at 10 and that, as shown below, obtains its name due to the nature of coupling signals as between respective transistor source nodes. QVCO 10 includes two symmetric oscillating circuits 20 and 40, which are inductively coupled together so as to lock the operation and oscillating signals of the two in quadrature, as will be explained later. Since circuits 20 and 40 are symmetric, the following discussion will detail circuit 20 by way of example, followed by a discussion of the comparable circuit 40.

Oscillating circuit 20 includes a first inductor 22 and a second inductor 24, each having a respective first terminal $22_{T1}$ and $24_{T1}$ connected to receive a fixed voltage potential, shown as $V_{DD}$, or note that inductors 22 and 24 may represent a single inductor with $V_{DD}$ connected to the center tap of that inductor. A second terminal $22_{T2}$ of inductor 22 is connected to a node 26, which is also connected to a drain of an nMOS transistor 28, and a second terminal $24_{T2}$ of inductor 24 is connected to a node 30, which is also connected to a drain of an nMOS transistor 32. The sources of nMOS transistors 28 and 32 are connected to a node 34, and the gates of nMOS transistors 28 and 32 are cross-coupled, that is, the gate of nMOS transistor 28 is connected to the drain of nMOS transistor 32, and the gate of nMOS transistor 32 is connected to the drain of nMOS transistor 28. Node 34 is connected to a first terminal $36_{T1}$ of a third inductor 36, and the second terminal $36_{T2}$ of third inductor 36 is connected to ground. Lastly, note that node 26 provides a first oscillating output signal I+, and node 30 provides a second oscillating output signal I−, where these two signals are antiphase (i.e., ideally 180 degrees apart) and occur in part in response to an induced signal from oscillating circuit 40, as also further detailed later.

As introduced above, oscillating circuit 40 is comparable in devices and connections with respect to oscillating circuit 20. As now will be appreciated, however, oscillating circuit 40 provides the quadrature Q outputs in part in response to an induced signal from oscillating circuit 20. Specifically, oscillating circuit 40 includes a first inductor 42 and a second inductor 44, each having a respective first terminal $42_{T1}$ and $44_{T1}$ connected to receive the fixed voltage potential, $V_{DD}$ (or again, those two inductors being a single inductor with $V_{DD}$ at its center tap). A second terminal $42_{T2}$ of inductor 42 is connected to a node 46, which is also connected to a drain of an nMOS transistor 48, and a second terminal $44_{T2}$ of inductor 44 is connected to a node 50, which is also connected to a drain of an nMOS transistor 52. The sources of nMOS transistors 48 and 52 are connected to a node 54, and the gates of nMOS transistors 48 and 52 are cross-coupled, that is, the gate of nMOS transistor 48 is connected to the drain of nMOS transistor 52, and the gate of nMOS transistor 52 is connected to the drain of nMOS transistor 48. Node 54 is connected to a first terminal $56_{T1}$ of a third inductor 56, and the second terminal $56_{T2}$ of third inductor 56 is connected to ground. Lastly, note that node 46 provides a first oscillating output signal Q+, and node 50 provides a second oscillating output signal Q−, where these two signals are ideally 180 degrees apart and occur in part in response to an induced signal from oscillating circuit 20, as also further detailed later.

The operation of QVCO 10 is now generally described for context in this document, with additional aspects readily known or ascertainable by one skilled in the art. Looking first to oscillating circuit 20, in general an oscillating loop may be observed with respect to inductors 22 and 24 and nMOS transistors 28 and 32. Particularly, with this loop, energy oscillates between the inductance and inherent transistor capacitance, and while resistance also exists in the circuit that would tend to diminish the response of the circuit, as known in the VCO art the cross-coupling of the gates of nMOS transistors 28 and 32 provides a negative conductance, sometimes also referred to as a −R, so as to compensate for this resistance and to maintain the loop in oscillation. Thus, this loop provides the oscillating signals I+ and I− which, as energy is exchanged in the loop and given the cross-coupling of nMOS transistors 28 and 32, causes the drain of one of those transistors to rise in voltage while the other falls in complementary fashion, and vice versa, such that I+ and I− at those drains are anti-phase signals, that is, they remain 180 degrees (i.e., one half-period) apart from one another. In addition to the above-described loop operation, note also that as one of nodes 26 and 30 rises, the other falls, thereby creating a symmetric and complementary signal in the other node, where these signals are also applied via nMOS transistors 28 and 32 to inductor 36. Inductor 36 then couples this energy to inductor 56 of oscillating circuit 40, that is, inductor 36, coupled to the sources of nMOS transistors 28 and 32, is coupled as one coil in a two coil transformer to inductor 56 of oscillating circuit 40, thereby coupling to the sources of nMOS transistors 48 and 52. Thus, the coupling of nMOS transistor 28 and 32 sources to nMOS transistor 48 and 52 sources gives rise to the descriptor of QVCO 10 being a source coupled device. Moreover, the polarity of the coupling between inductors 36 and 56 is shown by the known dot convention in the illustration, and, therefore, a current in one direction relative to inductor 36 corresponds to a current in the opposite direction in inductor 56. Thus, as further appreciated below, inductors 36 and 56 effectively form a transformer, whereby the antiphase signals of one loop are injected into the other, and the reverse currents of the two coupled inductors maintain an opposing-current and voltage and phase-shifted synchronization between one another.

Looking to oscillating circuit 40, it generally operates in the same way as oscillating circuit 20, albeit in a phase-shifted fashion, and the reader is assumed familiar therefore with the previous discussion which is now briefly summarized with respect to the comparable circuit 40. Generally, the loop of inductors 42 and 44 and nMOS transistors 48 and 52 oscillates and the opposing complementary potential at the drains of those transistors provides the antiphase output pairing of Q+ and Q−. Further, that loop is modulated by the coupling of the signals I+ and I−, from circuit 20 and via its inductor 36, into the respective inductor 56 in oscillating circuit 40.

Having described the general operation of circuits 20 and 40, note further that such operation locks oscillating circuit 20 in quadrature with respect to oscillating circuit 40. As noted above, in each circuit the outputs (i.e., either Q+ and Q− or I+ and I−) are antiphase signals. Particularly, oscillating circuit 20 includes inductor 36, and oscillating circuit 40 includes inductor 56, and the inductance of each may be selected so that the frequency of the common source node (i.e., node 34 or node 54) will resonate at the twice the frequency of the respective antiphase signals of each circuit, thereby maintaining the source voltage at all time below the drain voltages for each circuit; thus, in circuit 20, the voltage at node 34 remains below that of either nodes 26 and 30, and in circuit 40, the voltage at node 54 remains below that of either nodes 46 and 50. Moreover, with sufficient current through each of inductors 36 and 56, the loop non-linearity will select as between the odd mode and even mode, selecting that which has the higher oscillation amplitude. In this regard, the odd mode will prevail, thereby locking the two oscillating circuits in quadrature with respect to one another. The electromagnetic coupling as between inductors 36 and 56, as shown by the dot convention, further ensures the odd mode in that, as the dots indicate, a negative electromagnetically coupling factor (i.e., current in opposing directions) is maintained which, with the chosen values of inductors 36 and 38, maintains the common source voltages at nodes 34 and 54 antiphase with respect to one another (e.g., at twice the overall oscillation frequency), thereby locking the circuits in the odd mode and locking the output nodes in quadrature. Thus, as any one of the in-phase or quadrature nodes (26, 30, 46, or 50) varies, each of the others will vary and remain locked in quadrature, that is, maintaining each of the four signals at 90 degrees apart from one another.

Figure 2:
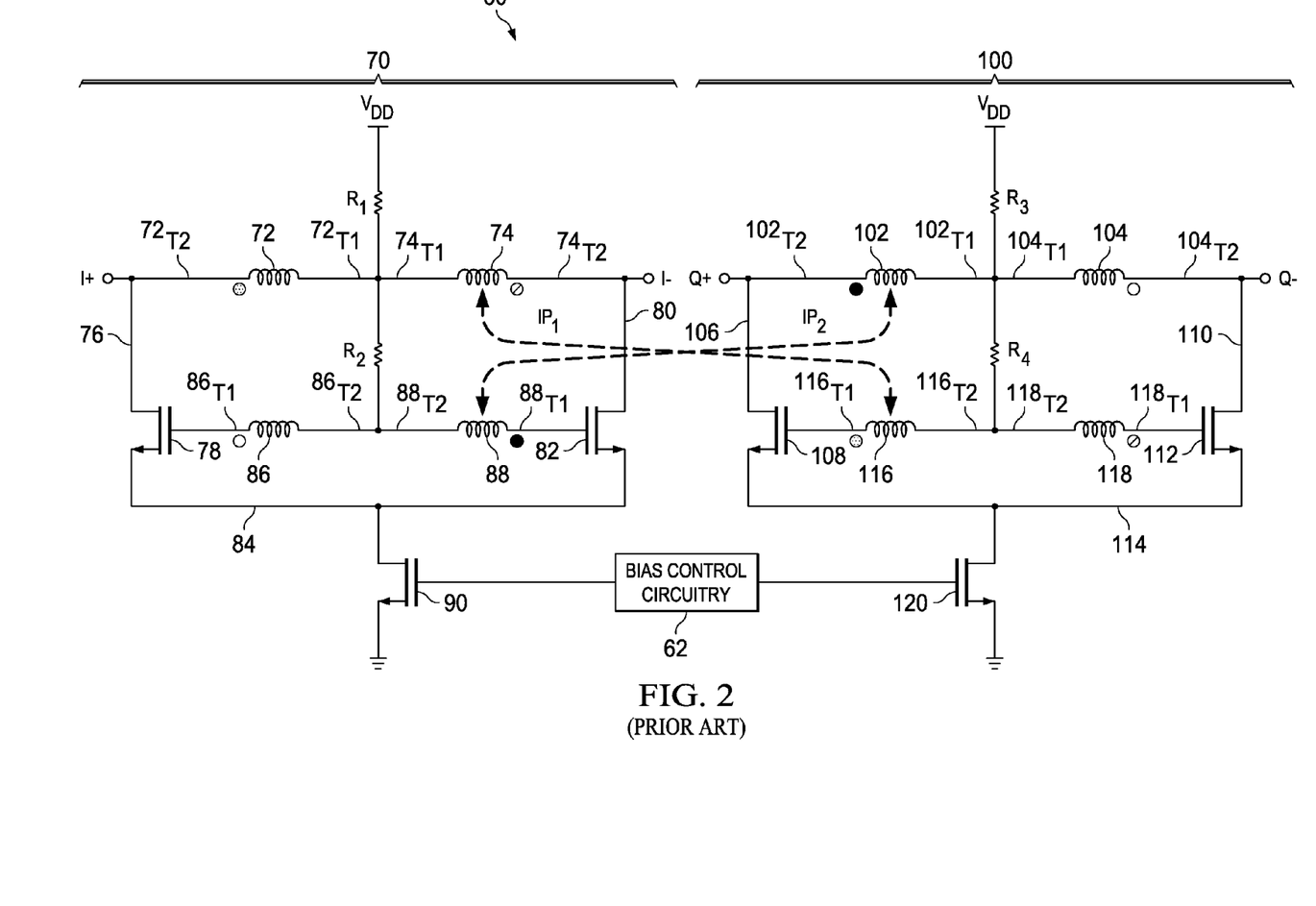
FIG. 2 illustrates an electrical schematic of a prior art drain-gate coupled QVCO.

FIG. 2 illustrates a schematic of a prior art drain-gate coupled QVCO shown generally at 60 and that, as shown below, obtains its name due to the nature of coupling signals as between a drain in one oscillating circuit and a transistor gate in another oscillating circuit. QVCO 60 includes bias control circuitry 62 that may be constructed according to known principles for biasing a QVCO and more particularly for biasing QVCO 60, as further explored below. QVCO 60 also includes two symmetric oscillating circuits 70 and 100, which are inductively coupled together so as to lock the operation and oscillating signals of the two in quadrature, as will be explained later. Since circuits 70 and 100 are symmetric, the following discussion will detail circuit 70 by way of example, followed by an overview of the comparable circuit 100.

Oscillating circuit 70 includes a first inductor 72 and a second inductor 74, each having a respective first terminal $72_{T1}$ and $74_{T1}$ connected to a first terminal of a resistor $R_1$, where the second terminal of resistor $R_1$ is connected to receive a fixed voltage potential, shown as $V_{DD}$. A second terminal $72_{T2}$ of inductor 72 is connected to a node 76, which is also connected to a drain of an nMOS transistor 78, and a second terminal $74_{T2}$ of inductor 74 is connected to a node 80, which is also connected to a drain of an nMOS transistor 82. The source of nMOS transistor 78 and of nMOS transistor 82 is connected to a node 84. The gate of nMOS transistor 78 is connected to a first terminal $86_{T1}$ of an inductor 86, and the gate of nMOS transistor 82 is connected to a first terminal $88_{T1}$ of an inductor 88. The second terminal $86_{T2}$ and the second terminal $88_{T2}$ of inductors 86 and 88, respectively, are connected together and to a first terminal of a resistor $R_2$, which has its second terminal connected to terminals $72_{T1}$ and $74_{T1}$ of inductors 72 and 74. Node 84 is connected to a drain of an nMOS transistor 90, which has it source connected to ground and its gate connected to bias control circuitry 62. Lastly, note that node 76 provides a first oscillating output signal I+, and node 80 provides a second oscillating output signal I−, where these two signals are ideally 180 degrees apart and occur in part in response to an induced signal from oscillating circuit 100, as also further detailed later.

As introduced above, oscillating circuit 100 is comparable in devices and connections with respect to oscillating circuit 70. Oscillating circuit 100, however, provides the quadrature Q outputs and operates in response to induced signals from I+ and I− of oscillating circuit 70. Specifically, oscillating circuit 100 includes a first inductor 102 and a second inductor 104, each having a respective first terminal $102_{T1}$ and $104_{T1}$ connected to a first terminal of a resistor $R_3$, where the second terminal of resistor $R_3$ is connected to $V_{DD}$. A second terminal $102_{T2}$ of inductor 102 is connected to a node 106, which is also connected to a drain of an nMOS transistor 108, and a second terminal $104_{T2}$ of inductor 104 is connected to a node 110, which is also connected to a drain of an nMOS transistor 112. The source of nMOS transistor 108 and of nMOS transistor 112 is connected to a node 114. The gate of nMOS transistor 108 is connected to a first terminal $116_{T1}$ of an inductor 116, and the gate of nMOS transistor 112 is connected to a first terminal $118_{T1}$ of an inductor 118. The second terminal $116_{T2}$ and the second terminal $118_{T2}$ of inductors 116 and 118, respectively, are connected together and to a first terminal of a resistor $R_4$, which has its second terminal connected to terminals $102_{T1}$ and $104_{T1}$ of inductors 102 and 104. Node 114 is connected to a drain of an nMOS transistor 120, which has it source connected to ground and its gate connected to bias control circuitry 62. Lastly, note that node 106 provides a first oscillating output signal Q+, and node 110 provides a second oscillating output signal Q−, where these two signals are ideally 180 degrees apart and occur in part in response to an induced signal from oscillating circuit 70, as also further detailed later.

Oscillating circuits 70 and 100 also are inductively coupled to one another, as is now described. The couplings in this respect are shown in FIG. 2 using the known inductor dot convention. Thus, inductor 72 of circuit 70 is coupled to inductor 116 of circuit 100, and inductor 74 of circuit 70 is coupled to inductor 118 of circuit 100—this coupling is also shown by way of a dashed inductive path arrow $IP_1$. Hence, the drain of nMOS transistor 78 is coupled via inductor 72 and inductor 116 to the gate of nMOS transistor 108, and the drain of nMOS transistor 82 is coupled via inductor 74 and inductor 118 to the gate of nMOS transistor 112. In this sense, therefore, the pair of inductors 72 and 74 forms a transformer pair with the pair of inductors 116 and 118. Further, inductor 86 of circuit 70 is coupled to inductor 104 of circuit 100, and inductor 88 of circuit 70 is coupled to inductor 102 of circuit 100—this coupling is also shown by way of a dashed inductive path arrow $IP_2$. Hence, the drain of nMOS transistor 108 is coupled via inductor 102 and inductor 88 to the gate of nMOS transistor 82, and the drain of nMOS transistor 112 is coupled via inductor 104 and inductor 86 to the gate of nMOS transistor 78. In this sense, therefore, the pair of inductors 86 and 88 forms a transformer pair with the pair of inductors 104 and 102. As is well known in the transformer art, therefore, a current through one (or one series pair) inductor will induce a current in the inductor to which it is inductively or magnetically coupled, typically by locating the inductors within a proximity to one another, with the distance of this proximity or other—magnetically coupling technique being ascertainable by one skilled in the art.

The operation of QVCO 60 is now generally described for context in this document, with additional aspects readily known or ascertainable by one skilled in the art and also as generally understood from the earlier discussion of FIG. 1. In general, QVCO 60 is a two stage ring oscillator with a coupled resonator as the load providing for a 90 degree phase shift. Looking then in more detail and first to oscillating circuit 70, in general an oscillating loop may be observed with respect to inductors 72 and 74, nMOS transistors 78 and 82, and nMOS transistor 90. Specifically, bias control circuitry 62 maintains nMOS transistor 90 on, and with the draw of current through inductors 72 and 74 an LC loop is created as between those inductors and the intrinsic capacitors of the transistors; moreover, a coupling is achieved in that Q+ and Q− from circuit 100 are coupled into circuit 70, inducing counterpart signals into the gates of transistors 78 and 82 to generate a mutual inductance effect, thereby locking the I+ and I− antiphase signals of circuit 70 into a quadrature spacing with the Q+ and Q− from circuit 100. At the same time, a comparable operation occurs in oscillating circuit 100, whereby inductors 102 and 104 provide an LC loop with nMOS transistors 108 and 112 so as to provide antiphase signals Q+ and Q−, while a cross-coupling is achieved in that I+ and I− from circuit 70 are coupled into circuit 100, inducing counterpart signals into the gates of transistors 108 and 112 to generate a mutual inductance effect, thereby locking the Q+ and Q− antiphase signals of circuit 100 into a quadrature spacing with the I+ and I− from circuit 70. Lastly, note that resistor $R_2$ and resistor $R_4$, of the same resistance, have resistance sufficiently large so as to eliminate any common mode oscillations, while resistor $R_1$ and resistor $R_3$, of the same resistance, have resistance for amplitude control (and may be digitally switched resistors).

Figure 3:
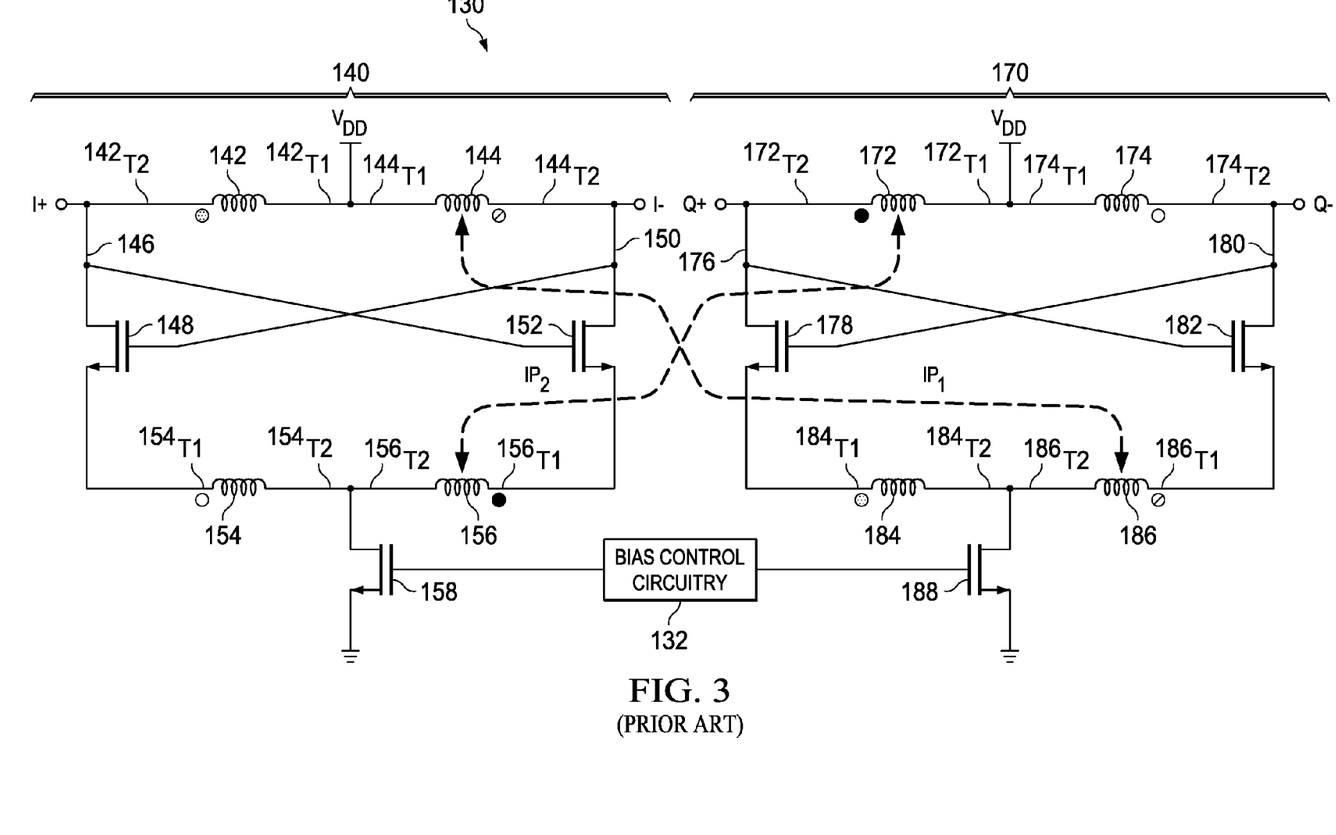
FIG. 3 illustrates an electrical schematic of a prior art drain-source coupled QVCO.

FIG. 3 illustrates a schematic of a prior art drain-source coupled QVCO shown generally at 130 and that, as shown below, obtains its name due to the nature of coupling signals as between a transistor drain in one oscillating circuit and a transistor source in another oscillating circuit. QVCO 130 includes bias control circuitry 132 that may be constructed according to known principles for biasing a QVCO and more particularly for biasing QVCO 130, as further explored below. QVCO 130 also includes two symmetric oscillating circuits 140 and 170, which are inductively coupled together so as to lock the operation and oscillating signals of the two in quadrature, as will be explained later. Since circuits 140 and 170 are symmetric, the following discussion will detail circuit 140 by way of example, followed by an overview of the comparable circuit 170.

Oscillating circuit 140 includes a first inductor 142 and a second inductor 144, each having a respective first terminal $142_{T1}$ and $144_{T1}$ connected to receive a fixed voltage potential, shown as $V_{DD}$. A second terminal $142_{T2}$ of inductor 142 is connected to a node 146, which is also connected to a drain of an nMOS transistor 148, and a second terminal $144_{T2}$ of inductor 144 is connected to a node 150, which is connected to a drain of an nMOS transistor 152. nMOS transistors 148 and 152 are cross-coupled, that is, the drain of nMOS transistor 148 is connected to the gate of nMOS transistor 152, and the drain of nMOS transistor 152 is connected to the gate of nMOS transistor 148. The source of nMOS transistor 148 is connected to a terminal $154_{T1}$ of an inductor 154, and the source of nMOS transistor 152 is connected to a terminal $156_{T1}$ of an inductor 156. A second terminal $154_{T2}$ of inductor 154 and a second terminal $156_{T2}$ of inductor 156 are connected to a drain of an nMOS transistor 158, which has its source connected to ground and its gate connected to bias control circuitry 132. Lastly, note that node 146 provides a first oscillating output signal I+, and node 150 provides a second oscillating output signal I−, where these two signals are ideally 180 degrees apart and occur in part in response to an induced signal from oscillating circuit 170, as also further detailed later.

As introduced above, oscillating circuit 170 is comparable in devices and connections with respect to oscillating circuit 140. Oscillating circuit 170, however, provides the quadrature Q outputs and operates in response to induced signals from I+ and I− of oscillating circuit 140. Specifically, oscillating circuit 170 includes a first inductor 172 and a second inductor 174, each having a respective first terminal $172_{T1}$ and $174_{T1}$ connected to receive $V_{DD}$. A second terminal $172_{T2}$ of inductor 172 is connected to a node 176, which is also connected to a drain of an nMOS transistor 178, and a second terminal $174_{T2}$ of inductor 174 is connected to a node 180, which is connected to a drain of an nMOS transistor 182. nMOS transistors 178 and 182 are cross-coupled, that is, the drain of nMOS transistor 178 is connected to the gate of nMOS transistor 182, and the drain of nMOS transistor 178 is connected to the gate of nMOS transistor 178. The source of nMOS transistor 178 is connected to a terminal $184_{T1}$ of an inductor 184, and the source of nMOS transistor 182 is connected to a terminal $186_{T1}$ of an inductor 186. A second terminal $184_{T2}$ of inductor 184 and a second terminal $186_{T2}$ of inductor 186 are connected to a drain of an nMOS transistor 188, which has its source connected to ground and its gate connected to bias control circuitry 132. Lastly, note that node 176 provides a first oscillating output signal Q+, and node 180 provides a second oscillating output signal Q−, where these two signals are ideally 180 degrees apart and occur in part in response to an induced signal from oscillating circuit 140, as also further detailed below.

Oscillating circuits 140 and 170 also are inductively coupled to one another, as is now described. The couplings in this respect are shown in FIG. 3 using inductor dot convention. Thus, inductor 142 of circuit 140 is coupled to inductor 184 of circuit 170, and inductor 144 of circuit 140 is coupled to inductor 186 of circuit 170—this coupling is also shown by way of a dashed inductive path arrow $IP_1$. Hence, the drain of nMOS transistor 148 is coupled via inductor 142 and inductor 172 to the source of nMOS transistor 178, and the drain of nMOS transistor 152 is coupled via inductor 144 and inductor 186 to the source of nMOS transistor 182. In this sense, therefore, the pair of inductors 142 and 144 form a transformer pair with the pair of inductors 184 and 186. Further, inductor 172 of circuit 170 is coupled to inductor 156 of circuit 140, and inductor 174 of circuit 170 is coupled to inductor 154 of circuit 140—this coupling is also shown by way of a dashed inductive path arrow $IP_2$. Hence, the drain of nMOS transistor 178 is coupled via inductor 172 and inductor 156 to the source of nMOS transistor 152, and the drain of nMOS transistor 182 is coupled via inductor 174 and inductor 154 to the source of nMOS transistor 148. In this sense, therefore, the pair of inductors 172 and 174 form a transformer pair with the pair of inductors 156 and 154. As is well known in the transformer art, therefore, a current through one (or one series pair) inductor will induce a current in the inductor to which it is inductively or magnetically coupled, typically by locating the inductors within a proximity to one another, with the distance of this proximity or other magnetically coupling technique being ascertainable by one skilled in the art.

The operation of QVCO 130 is now generally described for context in this document, with additional aspects readily known or ascertainable by one skilled in the art and also as generally understood from the earlier discussion of FIGS. 1 and 2. Looking first to oscillating circuit 140, in general an oscillating loop may be observed with respect to inductors 142 and 144, nMOS transistors 148 and 152, inductors 154 and 156, and nMOS transistor 158. Specifically, bias control circuitry 132 maintains nMOS transistor 158 on, and with the draw of current through inductors 142 and 144 and 154 and 156, an LC loop is created as between those inductors and the intrinsic capacitors of the transistors along with the negative conductance provided by the cross-coupling of the gates of nMOS transistors 148 and 152; moreover, a coupling is achieved in that Q+ and Q− from circuit 170 are coupled into the loop of circuit 140 to generate a mutual inductance effect, thereby locking the I+ and I− antiphase signals of circuit 140 into a quadrature spacing with the Q+ and Q− from circuit 170. At the same time, a comparable operation occurs in oscillating circuit 170, whereby inductors 172 and 174, and inductors 184 and 186, provide an LC loop with nMOS transistors 178 and 182, so as to provide antiphase signals Q+ and Q−, while a coupling is achieved in that I+ and I− from circuit 140 are coupled into circuit 170 to generate a mutual inductance effect, thereby locking the Q+ and Q− antiphase signals of circuit 170 into a quadrature spacing with the I+ and I− from circuit 140.

While the above and related approaches have served various needs in the prior art, they also provide various drawbacks. For example, the use of inductors in the prior art can account for a large percentage of the total area needed to implement the circuit, such that an amount of approximately seventy percent of the overall device layout is consumed by the device inductors. Moreover, power consumption also is a concern with QVCO devices.

Given the preceding, the present inventors seek to improve upon the prior art, as further detailed below.

BRIEF SUMMARY OF THE INVENTION

In a preferred embodiment, there is a quadrature voltage controlled oscillator (QVCO). The QVCO includes a first node for providing a first quadrature signal, a second node for providing a second quadrature signal, a third node for providing a third quadrature signal, and a fourth node for providing a fourth quadrature signal. The QVCO further includes a first coil connected between the first node and the second node and a second coil connected between the third node and the fourth node. The first coil and second coil are positively magnetically coupled.

Numerous other inventive aspects are also disclosed and claimed.

DETAILED DESCRIPTION OF EMBODIMENTS

FIGS. 1 through 3 were described above in the Background of the Invention section of this document, and the reader is assumed familiar with the principles of that discussion.

Figure 4:
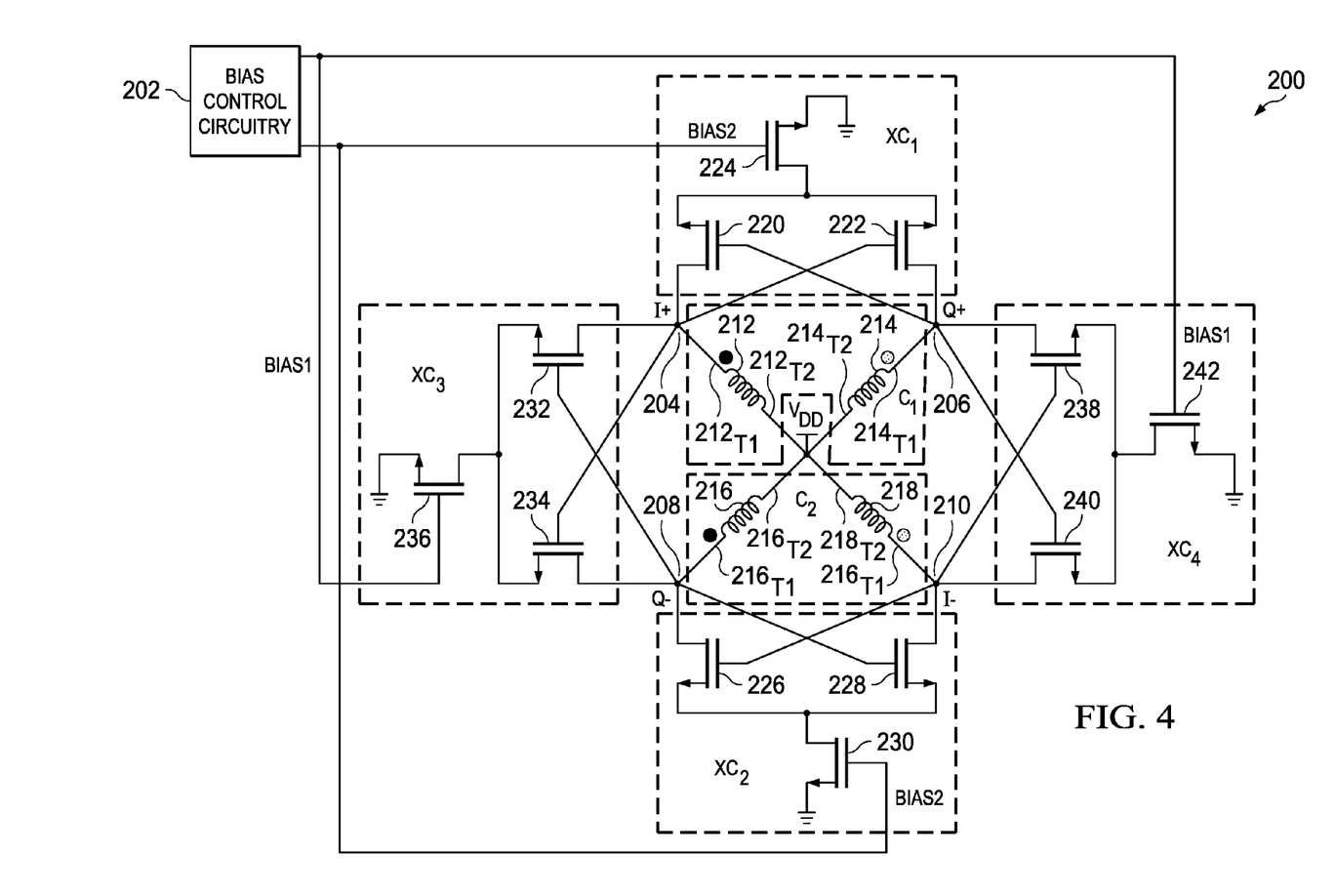
FIG. 4 illustrates an electrical schematic of a preferred embodiment QVCO.

FIG. 4 illustrates a schematic of a preferred embodiment quadrature voltage controlled oscillator (QVCO) shown generally at 200. QVCO 200 includes bias control circuitry 202 that may be constructed according to known principles for biasing a QVCO and more particularly for biasing transistors with QVCO 200, as further explored below. QVCO 200 also includes four nodes 204, 206, 208, and 210, each for providing a respective in-phase or quadrature signal, namely, I+, Q+, Q−, and I−, as further appreciated below.

QVCO 200 includes two inductors 212 and 214 that may be a single coil $C_1$ with an intermediary or center tap, and it also includes two additional inductors 216 and 218 that may be a single coil $C_2$, also with an intermediary or center tap. Coil $C_1$ is connected between nodes 204 and 206, and coil $C_2$ is connected between nodes 208 and 210. The center tap of each of coils $C_1$ and $C_2$ is connected to a fixed voltage potential, shown as $V_{DD}$. Coils $C_1$ and $C_2$ are also inductively or magnetically coupled together as shown in FIG. 4 using inductor dot convention. Unlike the various prior art QVCO descriptions set forth earlier, however, notably in FIG. 4 the dot convention demonstrates a positive (or additive) electromagnetically coupling factor (i.e., current in opposing directions) as between coils $C_1$ and $C_2$. In any event, apart from this change in polarity, again the electromagnetic coupling is achieved preferably by locating the inductors within a proximity to one another, with the distance of this proximity or other magnetically coupling technique being ascertainable by one skilled in the art.

QVCO 200 also includes various symmetric circuits, referred to herein as cross-coupled conduction circuits, coupled between pairings of the four signal nodes of QVCO 200. Specifically, a first cross-coupled conduction circuit $XC_1$ includes an nMOS transistor 220 having its drain connected to node 204 and its gate connected to node 206, an nMOS transistor 222 having its drain connected to node 206 and its gate connected to node 204, with the sources of both nMOS transistor 220 and nMOS transistor 222 connected to a drain on an nMOS transistor 224, which has its source connected to ground and receives a bias signal, BIAS2, at its gate, from bias control circuitry 202. A second cross-coupled conduction circuit $XC_2$ includes an nMOS transistor 226 having its drain connected to node 208 and its gate connected to node 210, an nMOS transistor 228 having its drain connected to node 210 and its gate connected to node 208, with the sources of both nMOS transistor 226 and nMOS transistor 228 connected to a drain of an nMOS transistor 230, which has its source connected to ground and receives the bias signal, BIAS2, at its gate, from bias control circuitry 202. A third cross-coupled conduction circuit $XC_3$ includes an nMOS transistor 232 having its drain connected to node 204 and its gate connected to node 208, an nMOS transistor 234 having its drain connected to node 208 and its gate connected to node 204, with the source of both nMOS transistor 232 and nMOS transistor 234 connected to a drain of an nMOS transistor 236, which has its source connected to ground and receives a bias signal, BIAS1, at its gate, from bias control circuitry 202. A fourth cross-coupled conduction circuit $XC_4$ includes an nMOS transistor 238 having its drain connected to node 206 and its gate connected to node 210, an nMOS transistor 240 having its drain connected to node 210 and its gate connected to node 206, with the source of both nMOS transistor 238 and nMOS transistor 240 connected to a drain of an nMOS transistor 242, which has its source connected to ground and receives the bias signal, BIAS1, at its gate, from bias control circuitry 202.

The operation of QVCO 200 is now described. In general, QVCO 200 is re-configurable by the selective application of BIAS1 and BIAS2 from bias control circuitry 202. More particularly, if only BIAS2 is applied (or likewise, if only BIAS1 is applied), then QVCO 200 operates in a differential mode. In the differential mode for the instance when only BIAS2 is applied, a first antiphase signal appears between nodes 204 and 206, while a second antiphase signal, in phase with the first antiphase signal, appears between nodes 208 and 210. Thus, for a device (e.g., a receiver) that requires only an oscillating signal, the differential mode of QVCO 200 may be selected and the oscillating signal provided as between nodes 204 and 206, or as between nodes 208 and 210. In addition, however, if both BIAS2 and BIAS1 are simultaneously applied, then QVCO 200 operates in a quadrature mode, where a first set of antiphase signals occurs between nodes 204 and 210, a second set of antiphase signals occurs between nodes 206 and 208, and the first and second antiphase signal sets are 90 degrees apart, that is, they are locked in quadrature. Thus, the quadrature mode also may be selected for a device that requires such signals (e.g., QPSK transceiver). Thus, the selective assertion of BIAS1 or BIAS2, or both BIAS1 and BIAS2, provide a single/dual bias control allowing for low-frequency based IQ phase alignment and tuning. Note also therefore that such BIAS control provides on the fly reconfiguration of the oscillation using benign and non-RF invasive bias-control knobs, between the two modes of differential and quadrature. Moreover, either the single or dual application of either or both biases allows for low frequency based IQ phase alignment and tuning. Each of these modes is separately discussed below.

In the differential mode of operation of QVCO 200, recall that bias control circuitry 202 asserts BIAS2, while leaving BIAS1 unasserted. With BIAS1 unasserted, the conductive paths in third cross-coupled conduction circuit $XC_3$ and fourth cross-coupled conduction circuit $XC_4$ are disabled, while with BIAS2 asserted, the conductive paths in first cross-coupled conduction circuit $XC_1$ and second cross-coupled conduction circuit $XC_2$ are enabled. In response to the latter, therefore, an oscillatory path is enabled corresponding to each of the first cross-coupled conduction circuit $XC_1$ and the second cross-coupled conduction circuit $XC_2$. Specifically, in connection with the first cross-coupled conduction circuit $XC_1$, current is drawn through nMOS transistor 224, thereby enabling in effect an oscillating circuit with respect to coil $C_1$ and nMOS transistors 220 and 222. At the same time, in connection with the second cross-coupled conduction circuit $XC_2$, current is drawn through nMOS transistor 230, thereby enabling in effect an oscillating circuit with respect to coil $C_2$ and nMOS transistors 226 and 228. Given the positive coupling as between coil $C_1$ and coil $C_2$ (i.e., relative polarity shown by dot convention), however, each of these two oscillators oscillates in phase with the other. As a result, with respect to the first cross-coupled conduction circuit $XC_1$, the signals at nodes 204 and 206 will oscillate in an antiphase manner with respect to one another, and with respect to the second cross-coupled conduction circuit $XC_2$, the signals at nodes 208 and 210 will oscillate in an antiphase manner with respect to one another, but both sets of signals (i.e., one at nodes 204 and 206, the other at nodes 210 and 208) will be in phase with respect to each other.

In the quadrature mode of operation of QVCO 200, recall that bias control circuitry 202 asserts both BIAS1 and BIAS2. As a result and as now discussed, each common drain node 204, 206, 208, and 210 provides a respective quadrature signal of I+, Q+, Q−, and I−. Specifically, with BIAS2 asserted, the conductive paths described in the previous paragraph are again enabled. In addition, however, with BIAS1 asserted, third cross-coupled conduction circuit $XC_3$ and fourth cross-coupled conduction circuit $XC_4$ are also both enabled. In this regard, therefore, note that each of the oscillating circuits are now no longer solely driven by their own respective voltages, but the signals from one oscillating circuit are also injected into the other, and vice versa. For example, consider node 208, which presents the Q− signal. The conductivity of the third cross-coupled conduction circuit $XC_3$, provides an additional conductive path through nMOS transistors 232 and 234, whereby the signal at node 204 is injected into node 208; likewise with the conductive path, the signal at node 208 is injected into node 204. Similar observations may be made with respect to the fourth cross-coupled conduction circuit $XC_4$. Particularly, as it is enabled by the asserted BIAS1 signal, it provides a conductive path between node 210 (providing I−), through nMOS transistors 240 and 38, to node 206 (providing Q+).

Figure 5:
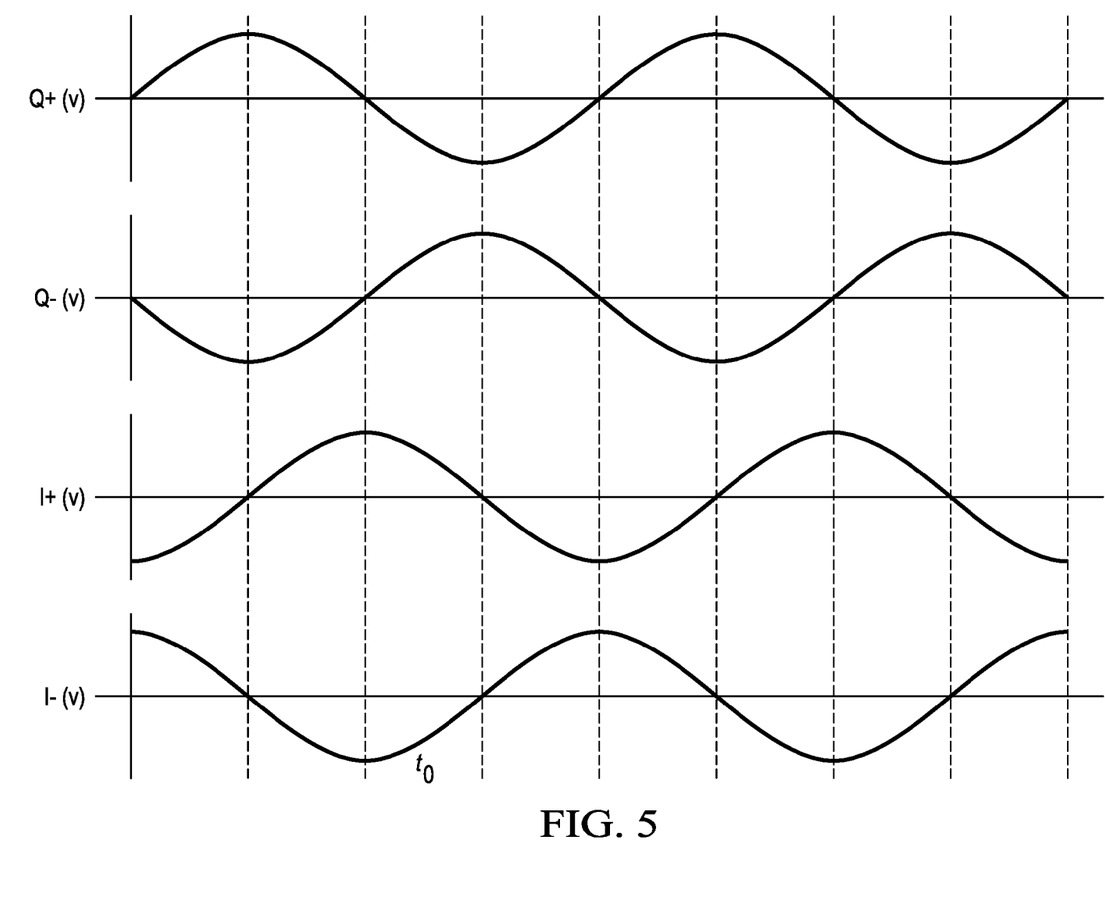
FIG. 5 illustrates a timing diagram of the in-phase and quadrature signals of the QVCO of FIG. 4.

Given the preceding, simulations confirm that in the quadrature mode the conductive paths provided by all cross-coupled conduction circuits will quadrature lock the four common drain nodes—because the LC characteristics of each of coils $C_1$ and $C_2$ and the respective capacitances of the various transistors through which a conductive path is formed, then the currents flowing through those LC tanks must have equal (assuming matching components) magnitude, thereby imposing a 90 degree phase shift as between a given common drain connected node and the drain of each other transistor to which the common drain connected node is connected to that other transistor's respective gate. As a first example, assume node 210 (presenting I−), at the drain of nMOS transistor 228, and at a time $t_0$, is at a 180 degree phase shift. That same drain connected node 210 is connected to the gate of nMOS transistor 238, so node 206 (presenting Q+) at the drain of the latter nMOS transistor 238 is shifted 90 degrees relative to common drain connected node 210, and so node 206 is at 270 degrees (i.e., +90 degrees relative to node 210). Similarly, that same drain connected node 210 of nMOS transistor 228 is connected to the gate of nMOS transistor 226, so node 208 (presenting Q−) at the drain of the latter nMOS transistor 226 is shifted 90 degrees relative to common drain connected node 210, and so node 208 is at 90 degrees (i.e., −90 degrees relative to node 210). As a second example, assume node 204 (presenting I+), at the drain of nMOS transistor 220, and at time $t_0$, is at a 0 degree phase shift. That same drain connected node 204 is connected to the gate of nMOS transistor 222, so node 206 (presenting Q+) at the drain of the latter nMOS transistor 222 is shifted 90 degrees relative to common drain connected node 204, and so node 206 is at 270 degrees (i.e., −90 degrees relative to node 204). Similarly, that same drain connected node 204 of nMOS transistor 232 is connected to the gate of nMOS transistor 234, so node 234 (presenting Q−) at the drain of the latter nMOS transistor 234 is shifted 90 degrees relative to common drain connected node 204, and so node 207 is at 90 degrees (i.e., +90 degrees relative to node 204). Given the preceding examples, one skilled in the art may trace the other comparable conductive paths in QVCO 200 in the quadrature mode, that is, with both BIAS1 and BIAS2 asserted, which will confirm the relative timing of the four common drain connected nodes, which timing is further illustrated by way of example in FIG. 5.

Figure 6A:
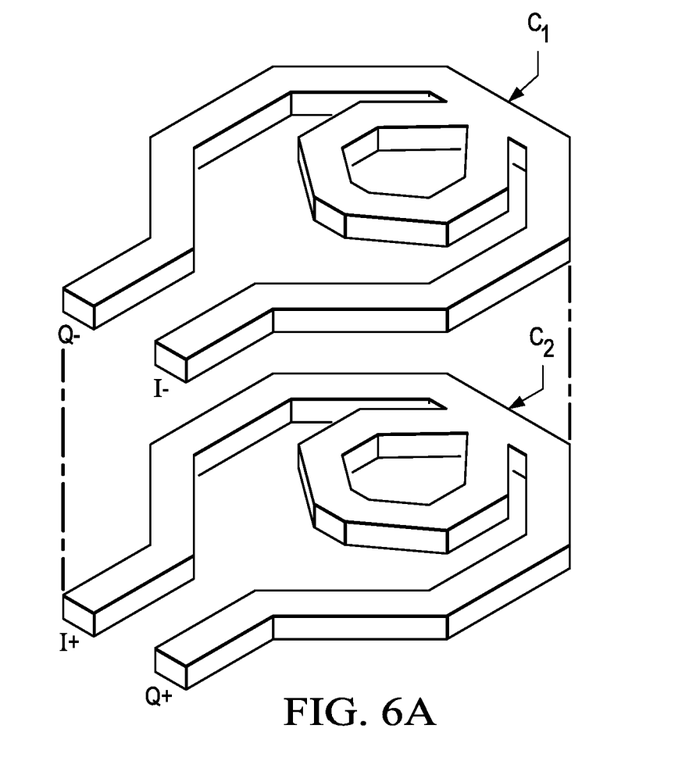
FIG. 6A illustrates an exploded perspective view of two inductors included in a preferred embodiment QVCO.
Figure 6B:
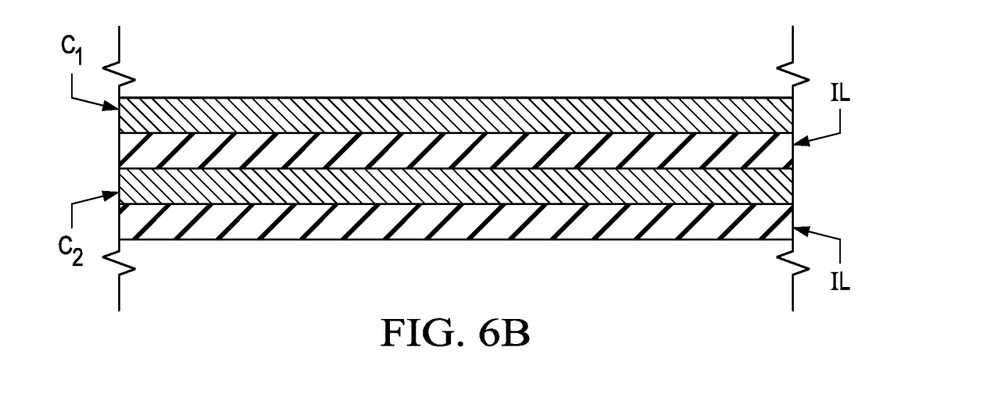
FIG. 6B illustrates a cross-sectional view of two inductors included in a preferred embodiment QVCO.

FIG. 6A illustrates a perspective exploded view, and FIG. 6B a side cross-sectional view, of a configuration in which each of inductor coils $C_1$ and $C_2$ may be formed in connection with well-known semiconductor and integrated circuit fabrication processes. In this preferred embodiment, each inductor coil is generally a same shape and may be formed so that a majority of the metal for the inductor is positioned in a different respective metal layer in a semiconductor process. As shown in the exploded view of FIG. 5A, therefore, in the metal layers of a semiconductor process, coils $C_1$ and $C_2$ may be formed from metal, one above the other; this is also shown by way of cross-section in FIG. 6B, where intermediate (e.g., insulating) layers IL are formed between the inductors and as between another layer (not shown for simplification). Given the shape and orientation in FIGS. 6A and 6B, note that in two dimensions (e.g., from a top-down view), therefore, the shape and borders of coil inductors $C_1$ and $C_2$ are vertically aligned, so that the area consumed by the device in those two dimensions is no greater than for a prior art single inductor device. Moreover, note further that the preferred embodiment of FIG. 4 also implements a QVCO with a considerably reduced amount of coils/inductors as compared to the prior art approaches described in the Background of the Invention section of this document. This gives rise to another preferred embodiment benefit in that typically inductors consume a considerable amount of two-dimensional area, particularly relative to the rest of the circuitry required to implement a QVCO (and related circuitry). Thus, the preferred embodiment FIG. 4 schematic may be achieved via FIGS. 6A and 6B with its two coils in a same two-dimensional space, by aligning the coils the third dimension (e.g., vertically) in line with the other inductors. Moreover, even if the two coils of the FIG. 4 preferred embodiment are implemented in a same layer, they still consume far less area than a prior art approach that required more inductors in a same layer.

From the above, the preferred embodiments are shown to provide a QVCO with improvements over the art. In a preferred embodiment, one improvement permits a two mode oscillator, with one (or a pair of) oscillating signal in a differential mode and quadrature signals in a quadrature mode. Another improvement, therefore, allows reduced power consumption and area when the QVCO is operated in the differential mode, as a single device may be integrated and used during the times when only a differential signal is needed. As still another improvement, the preferred embodiment achieves the quadrature signals with only two coils, drastically improving the amount of device size needed to implement the device. Thus, the preferred embodiments are demonstrated to have numerous benefits, and still others will be further determined by one skilled in the art. Still further, while various alternatives have been provided according to the disclosed embodiments, still others are contemplated and yet others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A quadrate voltage controlled oscillator, comprising:
   a first node for providing a first quadrature signal;
   a second node for providing a second quadrature signal;
   a third node for providing a third quadrature signal;
   a fourth node for providing a fourth quadrature signal;
   a first coil connected between the first node and the second node;
   a second coil connected between the third node and the fourth node, wherein the first coil and second coil are positively magnetically coupled;
   a first selectable conductive circuit coupled between the first node and the third node;

a second selectable conductive circuit coupled between the second node and the fourth node; and selection circuitry for disabling the first and second selectable conductive circuits and in response providing a first differential signal between the first node and the second node and a second differential signal between the third node and the fourth node, wherein the first differential signal and the second differential signal are in phase with respect to one another;

wherein the circuitry for disabling the first and second selectable conductive circuits disables the first and second selectable conductive circuits by disconnecting the first and second selectable conductive circuits from ground;

wherein the selection circuitry is further for enabling the first and second selectable conductive circuits and in response providing the first quadrature signal at the first node, the second quadrature signal at the second node, the third quadrature signal at the third node, and the fourth quadrature signal at the fourth node;

wherein each of the first, second, third, and fourth selectable conductive circuits comprises a respective additional transistor having a gate coupled to the selection circuitry.

* * * * *